(12) United States Patent
Kim et al.

(10) Patent No.: US 11,139,440 B2
(45) Date of Patent: Oct. 5, 2021

(54) THIN FILM TRANSISTOR AND METHOD OF MANUFACTURING THE SAME AND THIN FILM TRANSISTOR ARRAY PANEL AND ELECTRONIC DEVICE

(71) Applicant: Samsung Electronics Co., Ltd., Suwon-si (KR)

(72) Inventors: Joo Young Kim, Hwaseong-si (KR); Byong Gwon Song, Seoul (KR); Jeong Il Park, Seongnam-si (KR); Jiyoung Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/747,901

(22) Filed: Jan. 21, 2020

(65) Prior Publication Data

US 2021/0013435 A1 Jan. 14, 2021

(30) Foreign Application Priority Data

Jul. 8, 2019 (KR) .................. 10-2019-0082043

(51) Int. Cl.
| | |
|---|---|
| *H01L 51/05* | (2006.01) |
| *G02F 1/1368* | (2006.01) |
| *H01L 27/28* | (2006.01) |
| *H01L 51/00* | (2006.01) |

(52) U.S. Cl.
CPC ........ *H01L 51/0558* (2013.01); *G02F 1/1368* (2013.01); *H01L 27/283* (2013.01); *H01L 51/0005* (2013.01); *H01L 51/0074* (2013.01)

(58) Field of Classification Search
CPC .............. H01L 51/0558; H01L 27/283; H01L 51/0005; H01L 51/0074
See application file for complete search history.

(56) References Cited

U.S. PATENT DOCUMENTS

| | | | |
|---|---|---|---|
| 8,319,223 | B2 | 11/2012 | Kim et al. |
| 8,860,008 | B2 | 10/2014 | Lee et al. |
| 9,520,563 | B2 | 12/2016 | Mannsfeld et al. |

FOREIGN PATENT DOCUMENTS

| | | |
|---|---|---|
| KR | 100973811 B1 | 8/2010 |
| KR | 10-2014-0104520 A | 8/2014 |

*Primary Examiner* — Anthony Ho
(74) *Attorney, Agent, or Firm* — Harness, Dickey & Pierce, P.L.C.

(57) ABSTRACT

Disclosed are a thin film transistor including a source electrode and a drain electrode facing each other, a channel region between the source electrode and the drain electrode, and a gate electrode overlapped with the channel region, wherein the channel region includes a plurality of semiconductor stripes extending in a direction from the source electrode to the drain electrode, a method of manufacturing the same, a thin film transistor array panel, and an electronic device.

34 Claims, 18 Drawing Sheets

THIN FILM TRANSISTOR AND METHOD OF MANUFACTURING THE SAME AND THIN FILM TRANSISTOR ARRAY PANEL AND ELECTRONIC DEVICE

CROSS-REFERENCE TO RELATED APPLICATION

This application claims priority to and the benefit of Korean Patent Application No. 10-2019-0082043 filed in the Korean Intellectual Property Office on Jul. 8, 2019, the entire contents of which are incorporated herein by reference.

BACKGROUND

1. Field

A thin film transistor, a method of manufacturing the same, a thin film transistor array panel, and an electronic device are disclosed.

2. Description of the Related Art

A flat panel display such as a liquid crystal display (LCD), an organic light emitting diode (OLED) display, an electrophoretic display, and the like includes a pair of electric field-generating electrodes and an electrically active region interposed therebetween. The liquid crystal display (LCD), for example, includes a liquid crystal layer as an electrically active region, while the organic light emitting diode (OLED) display includes an organic emission layer as part of the electrically active region.

One of the pairs of the electric field-generating electrodes is commonly connected to a switching device, like a thin film transistor (TFT), and receives an electrical signal, and the electrically active region transforms the electrical signal into an optical signal and can, in concert with other electric field-generating electrodes, display an image.

Flat panel displays can include a three-terminal element as a switch, and may use a gate line for transferring a scan signal and for controlling the thin film transistor, and a data line for transferring a data signal to a pixel electrode.

SUMMARY

An embodiment provides a thin film transistor capable of realizing improved performance.

Another embodiment provides a method of manufacturing the thin film transistor.

Another embodiment provides a thin film transistor array panel including the thin film transistor.

Another embodiment provides an electronic device including the thin film transistor or the thin film transistor array panel.

According to an embodiment, a thin film transistor includes a source electrode and a drain electrode facing each other, a channel region between the source electrode and the drain electrode, and a gate electrode overlapped with the channel region, wherein the channel region includes a plurality of semiconductor stripes extending in a direction from the source electrode to the drain electrode.

In some example embodiments, the channel region may include an insulating stripe between adjacent semiconductor stripes and the semiconductor stripes and the insulating stripes may be alternately disposed.

In some example embodiments, a width of each semiconductor stripe may be about 100 nm to about 10 µm.

In some example embodiments, a width of each insulating stripe may be about 100 nm to about 5 µm.

In some example embodiments, the plurality of semiconductor stripes may be parallel to each other.

In some example embodiments, the channel region may further include a semiconductor pattern disposed at the periphery of the channel region.

In some example embodiments, the thin film transistor may further include a gate insulating layer having a plurality of trenches disposed in the channel region and each semiconductor stripe may be disposed in each trench.

In some example embodiments, the plurality of trenches may extend in a direction from the source electrode to the drain electrode.

In some example embodiments, a width of each trench may be about 100 nm to about 10 µm.

In some example embodiments, a depth of each trench may be about 20% to about 80% of a thickness of the gate insulating layer.

In some example embodiments, a thickness of the semiconductor stripe may be about 20% to about 80% of a thickness of the gate insulating layer.

In some example embodiments, the gate insulating layer may have a reservoir portion that is each connected to the plurality of trenches.

In some example embodiments, the thin film transistor may further include the semiconductor pattern disposed in the reservoir portion of the gate insulating layer.

In some example embodiments, the semiconductor stripe may include an organic semiconductor.

According to another embodiment, a method of manufacturing a thin film transistor includes forming a gate electrode, forming a gate insulating layer having a plurality of trenches at positions overlapped with the gate electrode, filling a semiconductor solution in the plurality of trenches to form a channel region including a plurality of semiconductor stripes, and forming a source electrode and a drain electrode electrically connected to the channel region.

In some example embodiments, the forming of the gate insulating layer having the plurality of trenches may be performed by photolithography, electron beam lithography, or imprinting.

In some example embodiments, the filling of the semiconductor solution in the plurality of trenches may include supplying the semiconductor solution to one end of the trench, and transferring the semiconductor solution from one end of the trench to the transverse end.

In some example embodiments, the supplying the semiconductor solution may be performed by inkjet printing, slit coating, drip casting, nozzle jet printing, or spraying.

In some example embodiments, the gate insulating layer may have a reservoir portion that is each connected to the plurality of trenches, and the filling the semiconductor solution in the plurality of trenches may include supplying the semiconductor solution to the reservoir portion and transferring the semiconductor solution from the reservoir portion through one end of the trench to the transverse end of the trench.

In some example embodiments, the supplying the semiconductor solution may be performed by inkjet printing, slit coating, drip casting, nozzle jet printing, or spraying.

In some example embodiments, the forming the channel region may further include heat-treating.

According to another embodiment, a thin film transistor array panel includes the thin film transistor.

According to another embodiment, an electronic device includes the thin film transistor array panel.

According to another embodiment, a thin film transistor array panel includes a plurality of thin film transistors arranged along rows and columns, and each thin film transistor includes a plurality of semiconductor stripes, the plurality of semiconductor stripes overlaps with the gate electrode and is between a source electrode and a drain electrode.

In some example embodiments, each semiconductor stripe may extend in a direction from the source electrode to the drain electrode.

In some example embodiments, the plurality of semiconductor stripes may be disposed to be parallel to each other.

In some example embodiments, the thin film transistor array panel may further include a gate insulating layer disposed in the whole surface of the thin film transistor array panel, and the plurality of semiconductor stripes may be filled in the gate insulating layer.

In some example embodiments, the gate insulating layer may have a plurality of trenches regions, the plurality of trenches regions being arranged along rows and columns and disposed between the source electrode and the drain electrode of each thin film transistor. In some example embodiments, each trench region may include a plurality of trenches, the plurality of trenches being extended in a direction from the source electrode to the drain electrode.

In some example embodiments, each semiconductor stripe may be disposed in each trench.

In some example embodiments, each trench region may further include a reservoir portion that is each connected to the plurality of trenches.

According to another embodiment, an electronic device includes the thin film transistor array panel.

A high performance thin film transistor may be realized.

DETAILED DESCRIPTION

Figure 1:
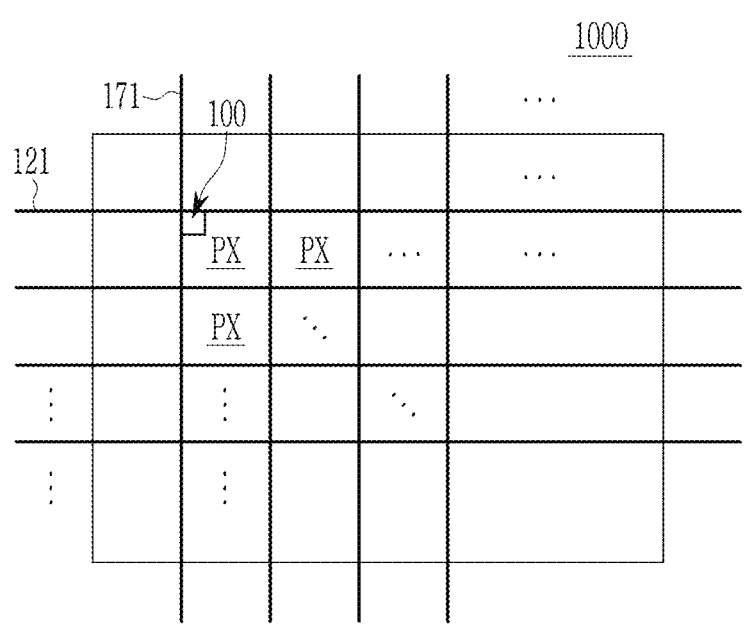
FIG. 1 is a schematic top view of a thin film transistor array panel in which thin film transistors are arranged according to some example embodiments.

Example embodiments of the present invention will hereinafter be described in detail, and may be easily performed by a person having an ordinary skill in the related art. However, this disclosure may be embodied in many different forms, and is not construed as limited to the example embodiments set forth herein.

As used herein, when a definition is not otherwise provided, "substituted" refers to replacement of hydrogen of a compound by a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C3 to C30 heteroaryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term "hetero" refers to one including 1 to 3 heteroatoms selected from N, O, S, Se, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a thin film transistor according to an embodiment is described.

Figure 2:
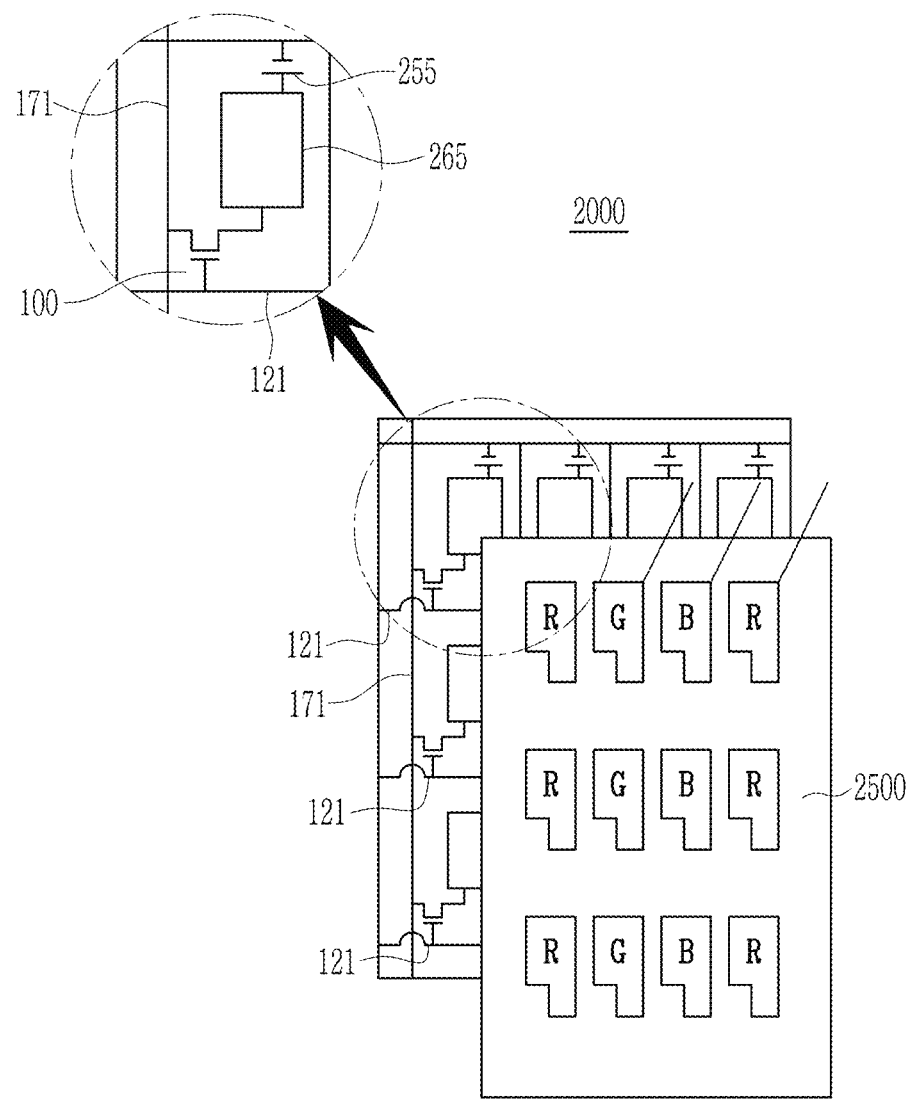
FIG. 2 is a schematic view showing an electronic device according to an example embodiment.
Figure 3:
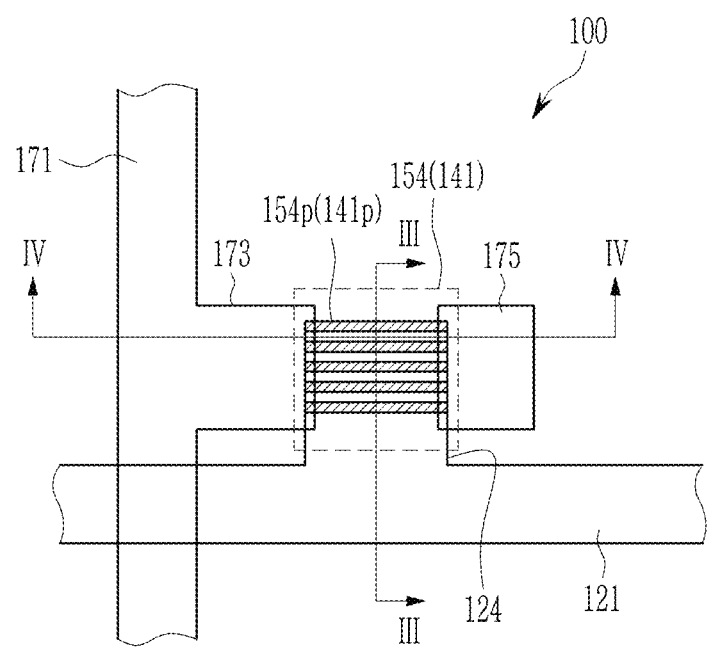
FIG. 3 is a top plan view enlarging one thin film transistor included in the thin film transistor array panel of FIG. 1.
Figure 4:
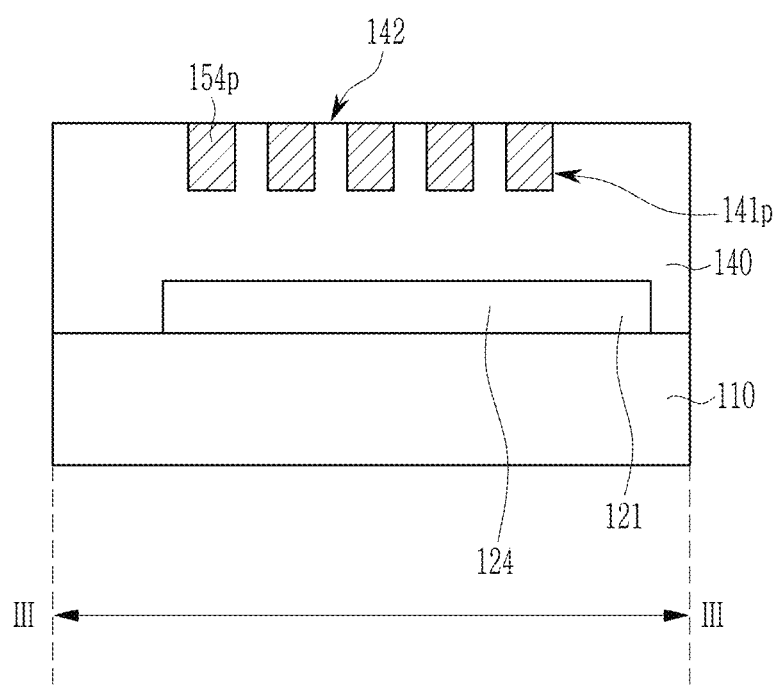
FIG. 4 is a cross-sectional view taken along line III-III of the thin film transistor of FIG. 2.
Figure 5:
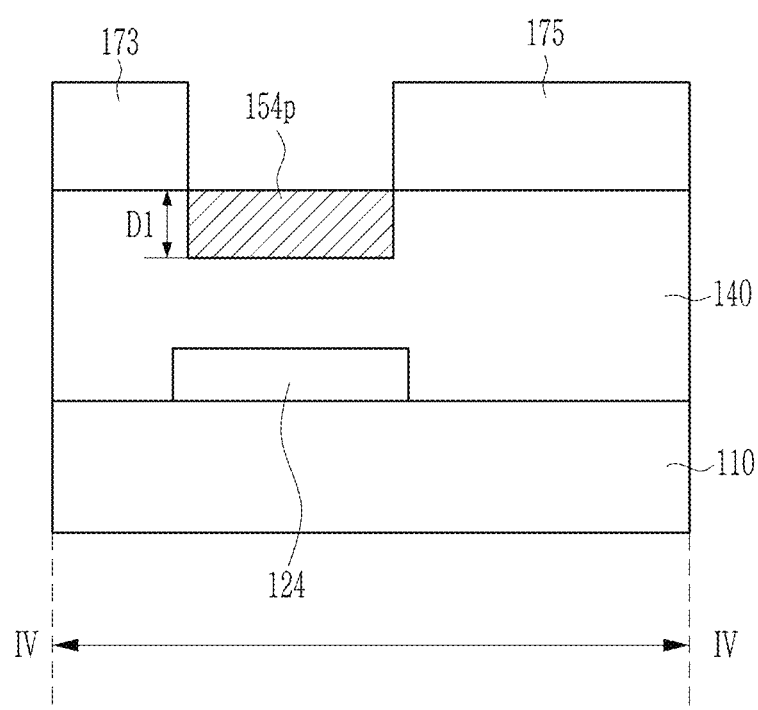
FIG. 5 is a cross-sectional view taken along line IV-IV of the thin film transistor of FIG. 2.
Figure 6:
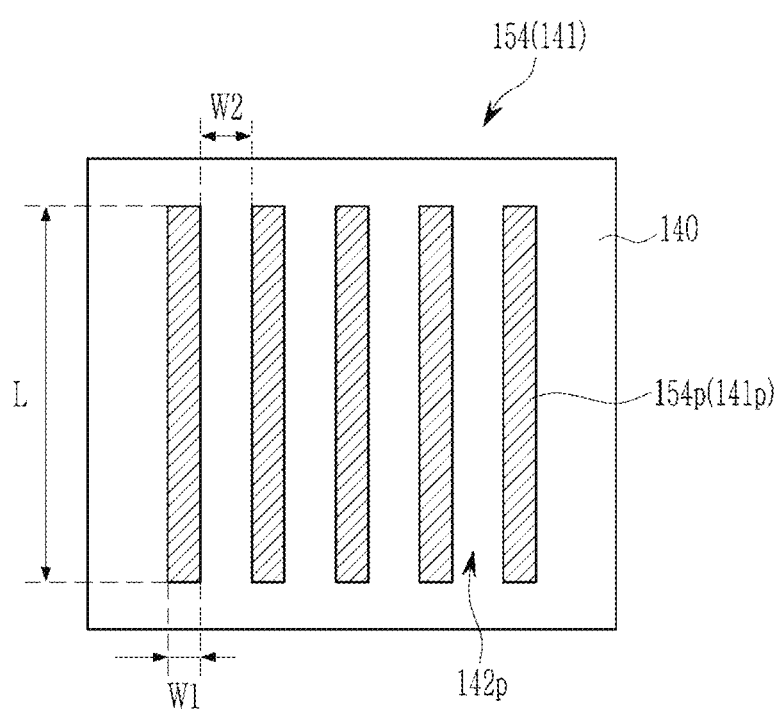
FIG. 6 is a top plan view showing an enlarged channel region according to some example embodiments of the thin film transistor of FIG. 3.
Figure 7:
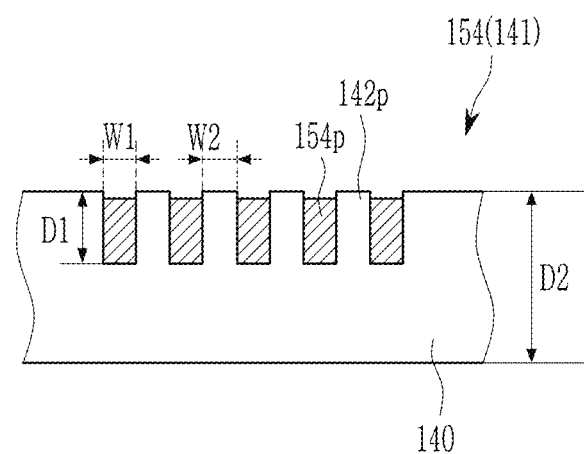
FIG. 7 is a cross-sectional view showing an enlarged channel region according to an some example embodiments of the thin film transistor of FIG. 3.

FIG. 1 is a schematic top view of a thin film transistor array panel in which thin film transistors are arranged according to some example embodiments. FIG. 2 is a schematic view showing an electronic device according to an example embodiment. FIG. 3 is a top plan view enlarging one thin film transistor included in the thin film transistor array panel of FIG. 1 and the electronic device of FIG. 2. FIG. 4 is a cross-sectional view taken along line III-III of the thin film transistor of FIG. 3. FIG. 5 is a cross-sectional view taken along line IV-IV of the thin film transistor of FIG. 3, FIG. 6 is a top plan view showing an enlarged channel region according to some example embodiments of the thin film transistor of FIG. 3, and FIG. 7 is a cross-sectional view showing an enlarged channel region according to some example embodiments of the thin film transistor of FIG. 3.

Referring to FIG. 1, a thin film transistor array panel 1000 may include a plurality of pixels (PXs) defined by a plurality of gate lines 121 and a plurality of data lines 171. The plurality of pixels (PXs) may be arranged in a matrix format along rows and/or columns. Each pixel PX may include one or two or more thin film transistors (TFTs) 100 as switching and/or driving elements. The thin film transistor 100 may be regularly arranged along rows and/or columns in the thin film transistor array panel 1000.

FIG. 2 is a schematic view showing an electronic device according to an example embodiment.

Referring to FIG. 2, an electronic device 2000 with an example TFT array panel 1000 as part of an LCD display. A storage capacitor 255 and a liquid-crystal capacitor 265 may be connected as a load to the TFT, with the liquid-crystal capacitor 265 changing phase when subjected to a sufficient data signal from the data line 171.

A light source (not illustrated) may produce light. The light may be blocked by the liquid-crystal capacitor 265 or may pass through the liquid crystal capacitor 265 and a glass color filter 2500 with red filters R, green filters G and blue filters B.

The above illustrates the TFT array panel 1000 as part of the electronic device 2000 in an example LED display. However, a person having ordinary skill in the art would understand that the array and the thin film transistor could be used as part of other electronic devices such as a liquid crystal display (LCD), an electrophoretic display device, an organic sensor, a wearable device, flexible sensors, mechanical sensors, or another electronic devices.

Referring to FIGS. 3 to 5, a thin film transistor 100 according to an embodiment includes a gate electrode 124, a source electrode 173, a drain electrode 175, a gate insulating layer 140, and a channel region 154.

The substrate 110 may support the thin film transistor array panel 1000 and may be for example an insulation substrate such as transparent glass or a polymer, or a silicon wafer. The polymer may include for example polyethylene terephthalate, polyethylene naphthalate, polycarbonate, polyacrylate, polyimide, or a combination thereof, but is not limited thereto.

The gate electrode 124 may be connected to a gate line 121 transferring a gate signal. The gate electrode 124 may be for example made of gold (Au), copper (Cu), nickel (Ni), aluminum (Al), molybdenum (Mo), chromium (Cr), tantalum (Ta), titanium (Ti), an alloy thereof, an organic conductor like a conductive polymer, nanostructured materials like graphene and metallic carbon nanotubes (CNT), or a combination thereof, but is not limited thereto. When the substrate 110 is a silicon wafer, the gate electrode 124 may be a doped region of the silicon wafer. The gate electrode 124 may include one layer or more layers.

The source electrode 173 may be connected to a data line 171 transferring a data signal. The source electrode 173 and the drain electrode 175 may face each other and may be centered on a gate electrode 124. The source electrode 173 and the drain electrode 175 may be a conductive metal including at least one metal of gold (Au), copper (Cu), nickel (Ni), aluminum (Al), molybdenum (Mo), chromium (Cr), tantalum (Ta), titanium (Ti), an alloy thereof, or a combination thereof, or may be conductive material like graphene, CNT, a conductive polymer, or a combination thereof. The source electrode 173 and the drain electrode 175 may be one layer or more layers.

The gate insulating layer 140 may be formed on the whole surface of the substrate 110 and may be between the gate electrode 124 and the source 173 and the drain 175 electrodes.

The gate insulating layer 140 may be made of an organic material, an inorganic material, and/or an organic/inorganic material. Examples of the organic material may be a polyvinyl alcohol-based compound, a polyvinyl phenol-based compound, a polyimide-based compound, a polyacryl-based compound, a polystyrene-based compound, benzocyclobutane (BCB), or a combination thereof. Examples of the inorganic material may be silicon nitride ($Si_xN_y$), silicon oxide ($SiO_2$), aluminum oxide ($Al_2O_3$), hafnium oxide ($HfO_2$), or a combination thereof. Examples of the organic/inorganic material may be polysiloxane, but is not limited thereto. The gate insulating layer 140 may be one layer or more layers.

The gate insulating layer 140 may include a plurality of trenches regions 141 in a region overlapped with the channel region 154. An area of the trench region 141 may share an area of the channel region 154 described later. The trench regions 141 may be arranged along rows and/or columns in thin film transistor array panel 1000. Each trench region 141 may overlap with the gate electrode 124 between the source electrode 173 and the drain electrode 175.

Each trench region 141 may include a plurality of trenches 141p. The trenches 141p may have a long and narrow concave pattern extending along one direction and span the distance between the source electrode 173 and the drain electrode 175. For example, the gate insulating layer 140 may have a surface portion having a first thickness D1 which corresponds to a thickness of the gate insulating layer 140 and the plurality of trenches 141p having a second thickness D2 which may be thinner than the first thickness D1.

The plurality of trenches 141p may be disposed at a predetermined distance, and each trench 141p may have a predetermined length, width, and depth. The length of the trench 141p may transverse the longitudinal distance between the source electrode 173 and the drain electrode 175.

For example, the lengths L of the trenches 141p may be the same or different from each other and may be for example about 1 μm to about 200 μm, about 1 μm to about 150 μm, or about 1 μm to about 100 μm.

A width W1 of the trench 141p may also be the same or different from each other, and may be about 100 nm to about 10 μm. Within the range, the width W1 of the trench 141p may be about 100 nm to about 7 μm, about 100 nm to about 5 μm, about 100 about nm to about 3 μm, about 100 nm to about 2 about μm, about 100 nm to about 1 μm, about 200 nm to about 1 μm, about 300 nm to about 1 μm, or about 500 nm to about 1 μm.

A depth D1 of the trenches 141p may also be the same or different from each another and in a range of about 20% to about 80% of a thickness D2 of the gate insulating layer 140 and within the range, for example, of about 30% to about 70%. For example, if the thickness D2 of the gate insulating layer 140 is about 30 nm to about 1 μm, the depth (D1) of the trench 141p may be about 10 nm to about 500 nm.

A distance W2 between adjacent trenches 141p may be the same or different from each other, for example, about 100 nm to about 5 μm. Within the range, the distance W2 between adjacent trenches 141p may be about 100 nm to about 3 μm, about 100 nm to about 2 μm, about 100 nm to about 1 μm, about 200 nm to about 1 μm, or about 300 nm to about 1 μm.

The plurality of trenches 141p in each trench region 141 may be substantially disposed in parallel but is not limited thereto, and at least some of the plurality of trenches 141p may be non-parallel to each other. The plurality of trenches 141p in each trench region 141 may also be nonlinear, and may be other longitudinal shapes like a wave, a repeating chevron, and a convex or concave rectangle.

The channel region 154 is a region where a channel of the thin film transistor 100 is formed, and includes a region overlapped with the gate electrode 124 between the source electrode 173 and the drain electrode 175. The channel region 154 may be arranged with the trench length oriented towards the rows and/or columns in a thin film transistor array panel 1000.

The channel region 154 may include a plurality of semiconductor stripes 154p. The semiconductor stripes 154p may have a long and narrow semiconductor pattern which is extended along a direction heading from the source electrode 173 to the drain electrode 175. For example, the semiconductor stripes 154p may extend along the direction of the channel length.

The semiconductor stripes 154p may be disposed within the trench 141p of the gate insulating layer 140, for example, embedded in the trench 141p. Accordingly, each semiconductor stripe 154p and each trench 141p may have a substantially similar shape to each other. Thus, if the plurality of trenches 141p is a nonlinear shape, than the semiconductor stripe 154p may also be a nonlinear shape like a wave, a repeating chevron, and a convex or concave rectangle.

The plurality of semiconductor stripes 154p in each channel region 154 may be disposed at a predetermined distance, and each semiconductor stripe 154p may have a bar shape having a predetermined length, width, and thickness. A length direction of the semiconductor stripe 154p may coincide with a direction traversing the source electrode 173 and the drain electrode 175, for example, the channel length direction.

A surface portion of the gate insulating layer 140 may be disposed between the adjacent semiconductor stripes 154p. The surface portion of the gate insulating layer 140 between the adjacent semiconductor stripes 154p may form an insulating stripe 142p having a predetermined width. Accordingly, the semiconductor stripe 154p and the insulating stripe 142p may be alternately disposed in each channel region 154.

For example, a length L of the semiconductor stripe 154p may be the same as or larger than a channel length, and may be in a range of about 1 μm to about 200 μm, about 1 μm to about 150 μm, or about 1 μm to about 100 μm.

The width W1 of the semiconductor stripe 154p may be substantially equal to the width of the trench 141p. For example, the width W1 of the semiconductor stripe 154p may be the same or different from each other, and may be about 100 nm to about 10 μm. Within the range, the width W1 of the semiconductor stripe 154p may be about 100 nm to about 7 μm, about 100 nm to about 5 μm, about 100 about nm to about 3 μm, about 100 nm to about 2 about μm, about 100 nm to about 1 μm, about 200 nm to about 1 μm, about 300 nm to about 1 μm, or about 500 nm to about 1 μm.

The distance between the adjacent semiconductor stripes 154p, that is, the width W2 of the insulating stripe 142p may be thicker or thinner than the width W1 of the semiconductor stripe 154p. The distance between the semiconductor stripes 154p may also be the same or different from one another, for example, about 100 nm to about 5 μm. Within the range, the distance between the semiconductor stripes may be about 100 nm to about 3 μm, about 100 nm to about 2 μm, about 100 nm to about 1 μm, about 200 nm to about 1 μm, or about 300 nm to about 1 μm.

The adjacent semiconductor stripes 154p may also be in parallel but are not limited thereto, and at least some of the plurality of semiconductor stripes 154p may be non-parallel to the other semiconductor stripes 154p.

The semiconductor stripe 154p may include a semiconductor material, for example an inorganic semiconductor material, an organic semiconductor material, or a combination thereof. For example, the semiconductor stripe 154p may include a soluble organic semiconductor material, like a soluble low molecular organic semiconductor and/or polymeric semiconductor.

The semiconductor stripe 154p may be formed by supplying a semiconductor solution to the trench 141p of the gate insulating layer 140. The semiconductor solution may move to the transverse end of the trench 141p due to the capillary effect, and thus fill the trench 141p to obtain the semiconductor stripe 154p filled or embedded in the trench 141p.

In this way, as the semiconductor solution may molecularly align to due to the spontaneously movement. A degree of molecular alignment of the semiconductor solution may also improve the charge mobility of the semiconductor stripe 154p. In particular, the direction in which the semiconductor solution moves by the capillary effect may coincide with the length direction of the semiconductor stripe 154p, and the channel length direction of the thin film transistor 100. As the molecules in the semiconductor solution may be effectively aligned in the direction in which the charge moves the charge carriers may move through the semiconductor stripes more effectively.

The organic semiconductor material may have an average molecular weight of less than or equal to about 3,000. For example, the organic semiconductor material may be an aromatic compound and/or a heteroaromatic compound; and/or a fused polycyclic aromatic compound and/or a fused polycyclic heteroaromatic compound, such as pentacene and/or a fused polycyclic heteroaromatic compound including at least one O, S, Se, Te, N, or a combination thereof. For example, the organic semiconductor material may be a fused polycyclic aromatic compound and/or a fused polycyclic heteroaromatic compound having a compact planar structure wherein three or more rings are fused with each other, like a fused polycyclic aromatic compound and/or a fused polycyclic heteroaromatic compound wherein 4, 5, 6, 7, 8, 9, 10, 11, or 12 rings are condensed.

For example, the organic semiconductor material may be represented by Chemical Formula 1A or 1B.

[Chemical Formula 1A]

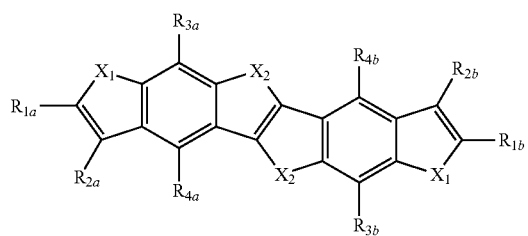

[Chemical Formula 1B]

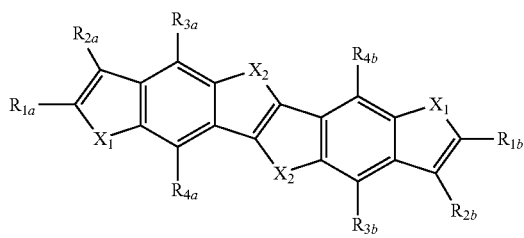

In Chemical Formulae 1A and 1B,

X1 and X2 may each independently be O, S, Se, Te, or N-Ra, wherein Ra is hydrogen, a substituted or unsubstituted C1 to C20 alkyl group, a substituted or unsubstituted C6 to C30 arylalkyl group, a substituted or unsubstituted C6 to C30 aryl group, a substituted or unsubstituted C1 to C12 alkoxy group, a substituted or unsubstituted C1 to C30 acyl group, a sulfonyl group, or a carbamate group, and $R_{1a}$, $R_{1b}$, $R_{2a}$, $R_{2b}$, $R_{3a}$, $R_{3b}$, $R_{4a}$, and $R_{4b}$ may each independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

For example, $R_{1a}$ and $R_{1b}$ may be the same or different, and for example $R_{1a}$ may be hydrogen or a substituted or unsubstituted C1 to C20 alkyl group, and $R_{1b}$ may be a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

For example, $R_{2a}$ and $R_{2b}$ may be the same or different, and for example $R_{2a}$ may be hydrogen or a substituted or unsubstituted C1 to C20 alkyl group, and $R_{2b}$ may be a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

For example, $R_{3a}$ and $R_{3b}$ may be the same or different, and for example $R_{3a}$ may be hydrogen or a substituted or unsubstituted C1 to C20 alkyl group and $R_{3b}$ may be a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

For example, $R_{4a}$ and $R_{4b}$ may be the same or different, and for example $R_{4a}$ may be hydrogen or a substituted or unsubstituted C1 to C20 alkyl group and $R_{4b}$ may be a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

The organic semiconductor material represented by Chemical Formula 1A may be for example represented by Chemical Formula 1A-1 and the organic semiconductor material represented by Chemical Formula 1B may be for example represented by Chemical Formula 1B-1.

[Chemical Formula 1A-1]

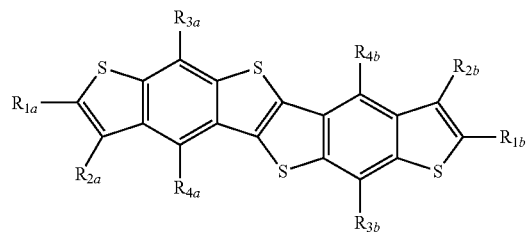

[Chemical Formula 1B-1]

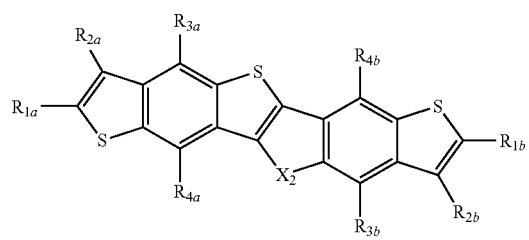

In Chemical Formulae 1A-1 and 1B-1, $R_{1a}$ to $R_{4b}$ are the same as described above.

The organic semiconductor material represented by Chemical Formula 1A or 1B may be, for example, the following compounds, but is not limited thereto.

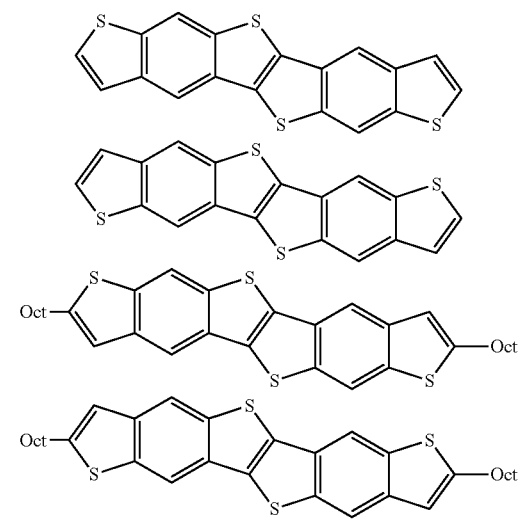

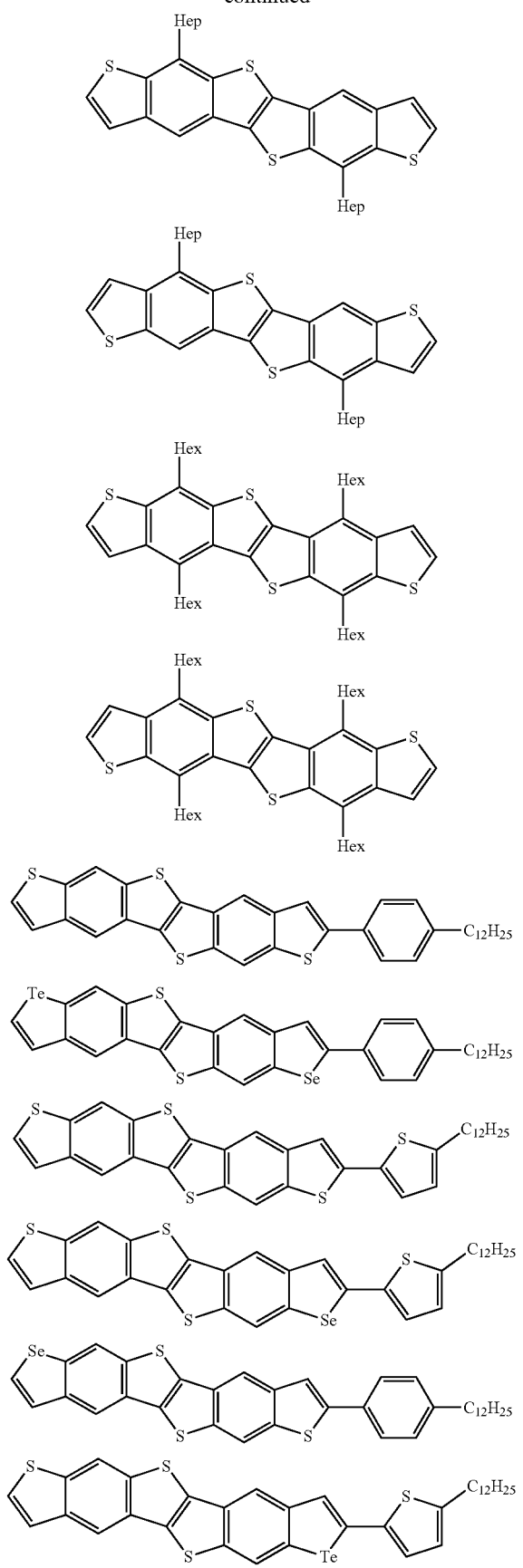
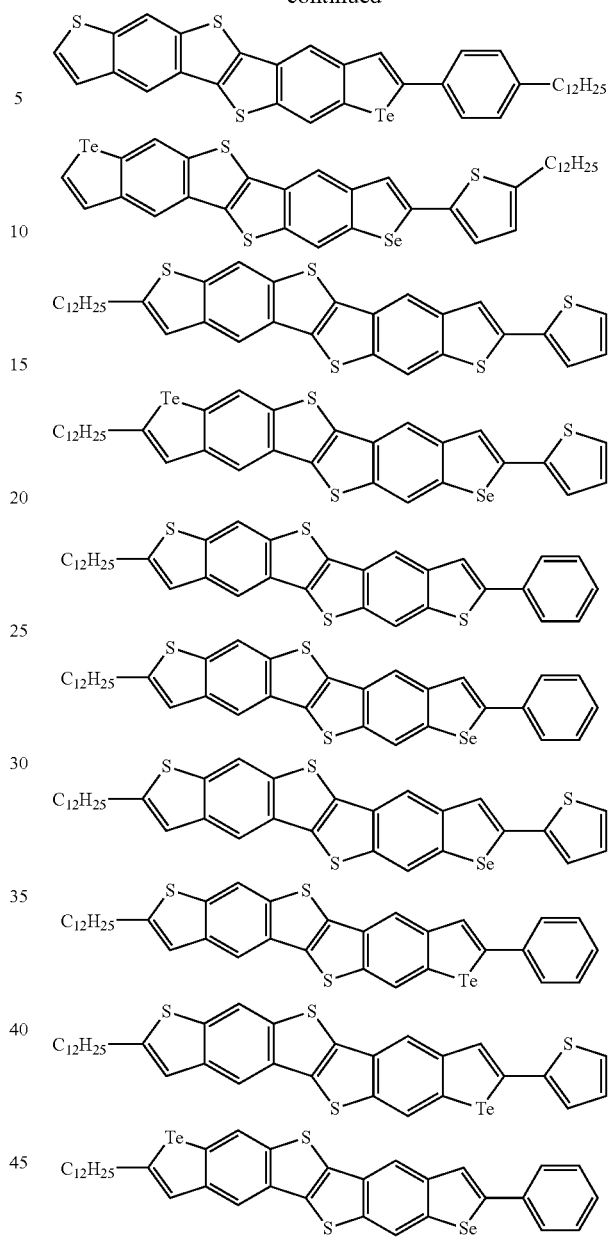
In the compounds, Hex, Hep, and Oct are independently a hexyl group, a heptyl group, and an octyl group.
For example, the organic semiconductor material may be represented by Chemical Formula 2A or 2B.
[Chemical Formula 2A]
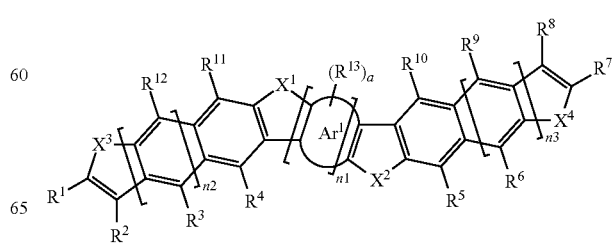

[Chemical Formula 2B]

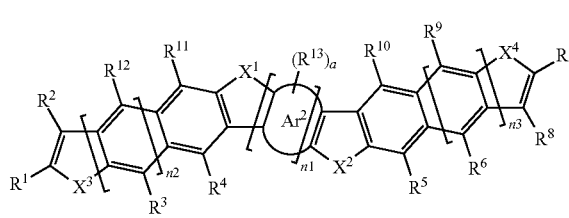

In Chemical Formulae 2A and 2B,

Ar¹ and Ar² may each independently be phenylene, naphthalene, or anthracene, a corresponds to the number of hydrogen bonded with carbon of Ar¹ and Ar², $X^1$ to $X^4$ may independently be O, S, Se, Te, or N-Ra, wherein $R^a$ may each independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C7 to C30 arylalkyl group, a substituted or unsubstituted C6 to C30 aryl group, a substituted or unsubstituted C1 to C30 alkoxy group, a substituted or unsubstituted C6 to C30 aryloxy group (—$OR^b$, wherein $R^b$ is a substituted or unsubstituted C6 to C30 aryl group), a substituted or unsubstituted C4 to C30 cycloalkyl group, a substituted or unsubstituted C4 to C30 cycloalkyloxy group (—$OR^c$, wherein $R^c$ is a substituted or unsubstituted C4 to C30 cycloalkyl group), a substituted or unsubstituted C2 to C30 heteroaryl group, an acyl group (—C(=O)$R^d$, wherein $R^d$ is a substituted or unsubstituted C1 to C30 alkyl group), a sulfonyl group (—S(=O)$_2R^e$, wherein $R^e$ is a substituted or unsubstituted C1 to C30 alkyl group) or a carbamate group (—NHC(=O)$OR^f$, wherein $R^f$ is a substituted or unsubstituted C1 to C30 alkyl group), $R^1$ to $R^{13}$ may independently be hydrogen, a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group, n1 may be 0 or 1, n2 and n3 may independently be 0, 1, 2, or 3, when n1 is 0, n2 and n3 may be 1, 2, or 3, and when n1 is 1, n1+n2+n3≥2.

$R^1$ and $R^7$ may be substituted, and may be for example a substituted or unsubstituted C1 to C30 alkyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

$R^1$ and $R^7$ may be a fluoro-substituted C1 to C30 alkyl group.

$R^a$ may be a substituted or unsubstituted C10 to C30 alkyl group, a substituted or unsubstituted C10 to C30 alkoxy group, a substituted or unsubstituted C10 to C30 alkenyl group, or a substituted or unsubstituted C10 to C30 alkynyl group, for another example, a fluoro-substituted C1 to C30 alkyl group, desirably a C1 to C30 perfluoro alkyl group ($C_nF_{2n+1}$, wherein n is an integer of greater than or equal to 1), or a fluoro-substituted C10 to C30 alkyl group, desirably a C10 to C30 perfluoro alkyl group ($C_nF_{2n+1}$, wherein n is an integer of 10 to 30).

In Chemical Formulae 2A and 2B, when n1 is 0, n2 and n3 may be an integer of 1, 2, or 3 and when n1 is 1, n1+n2+n3≥2, for example when n1 is 1, both n2 and n3 may not be 0.

In Chemical Formulae 2A and 2B, when n1 is 0, n2 and n3 may be an integer of 1, 2, or 3 and when n1 is 1, n1+n2+n3≥2, for example when n1 is 1, both n2 and n3 may not be 0.

(1)

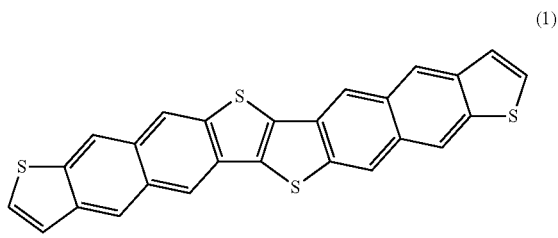

(2)

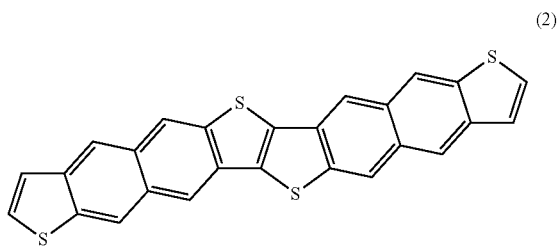

(1a)

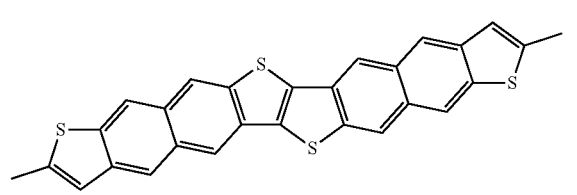

(1b)

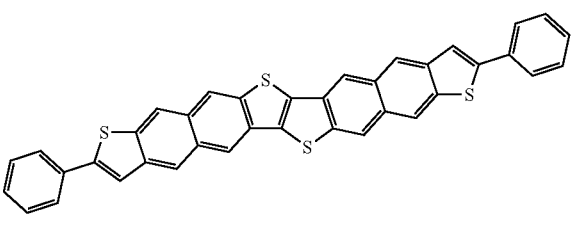

(3)

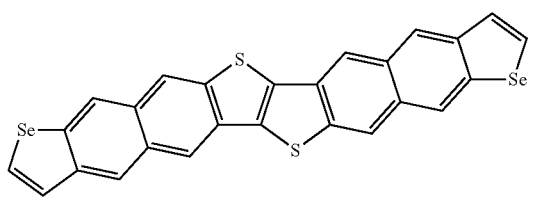

-continued
(4)
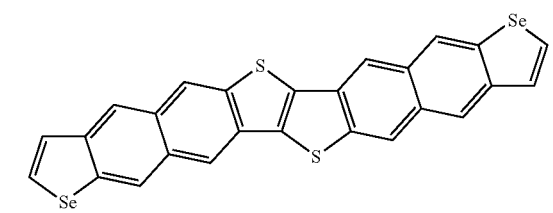
(5)
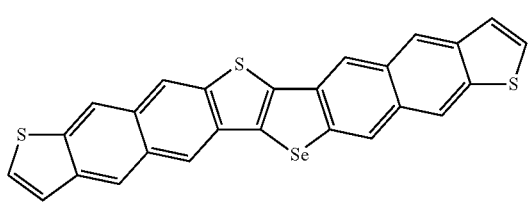
(6)
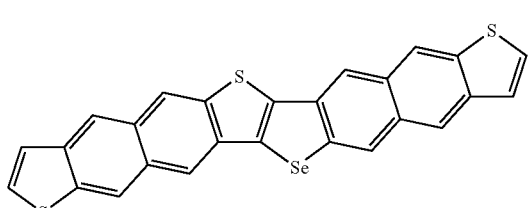
(7)
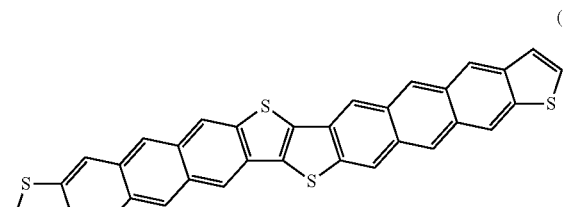
(8)
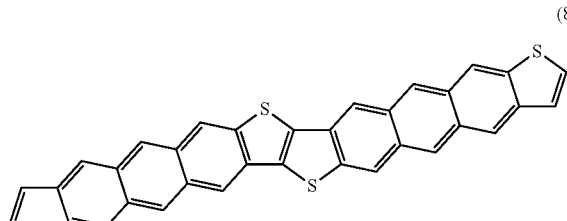
(9)
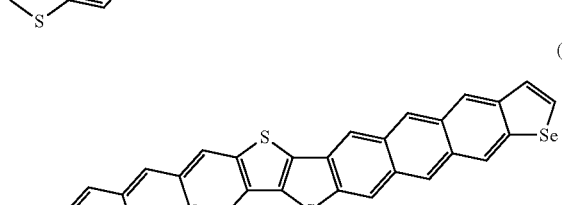
(10)
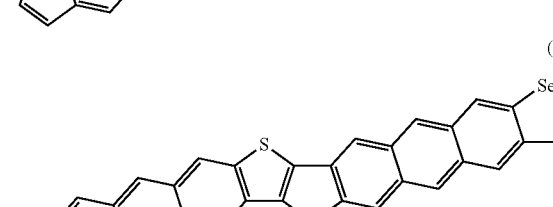
-continued
(11)
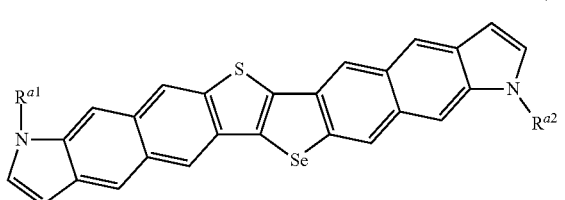
(12)
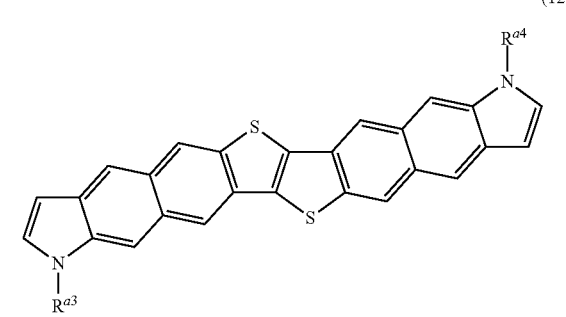
(13)
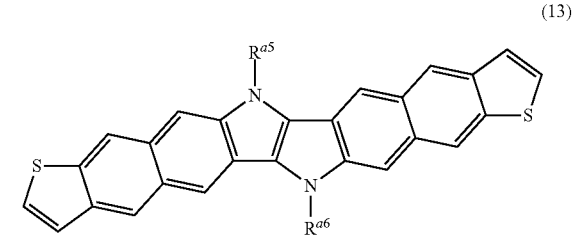
(14)
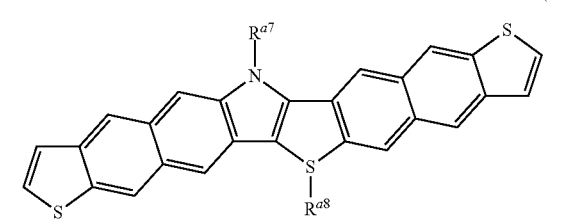
(15)
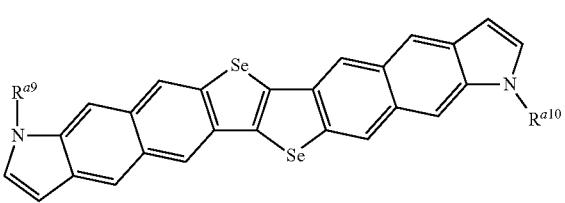
(16)
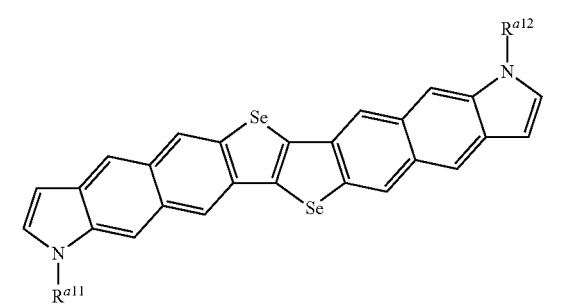

-continued
(17)
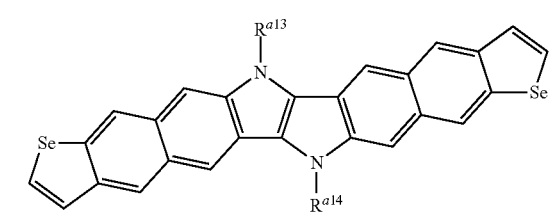
(18)
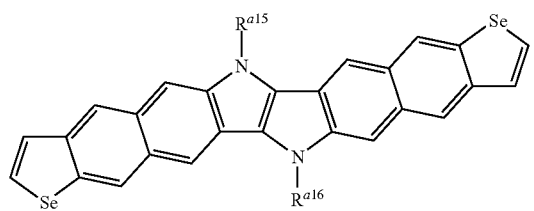
(19)
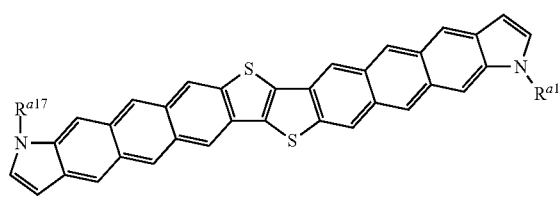
(20)
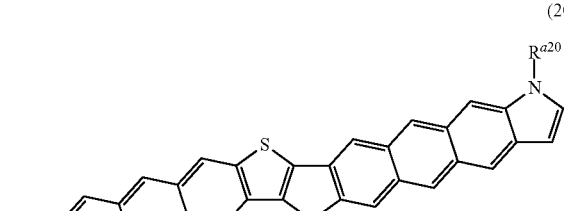
(21)
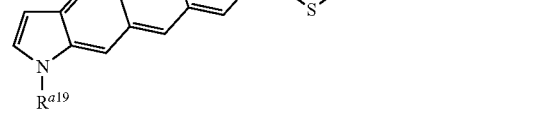
(22)
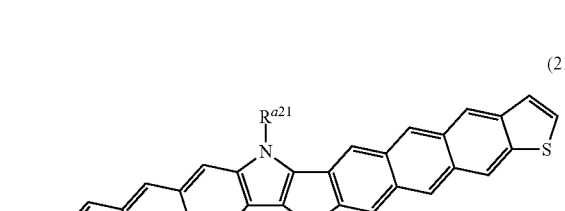
(23)
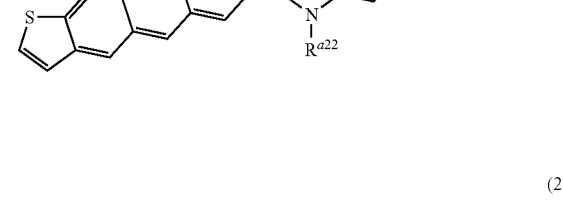
(24)
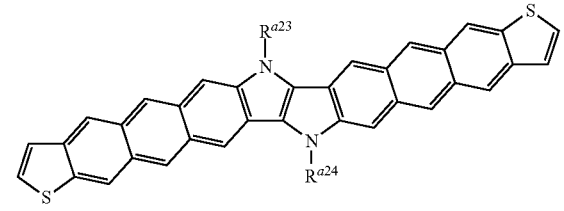
(25)
(26)
(27)
(28)
(29)

(30)
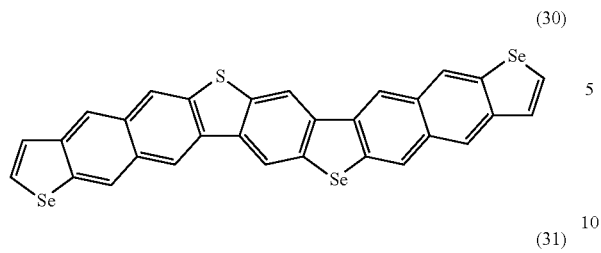
(31)
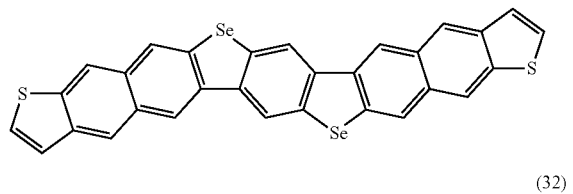
(32)
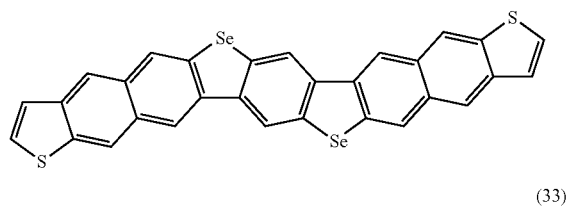
(33)
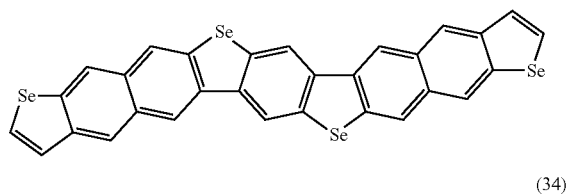
(34)
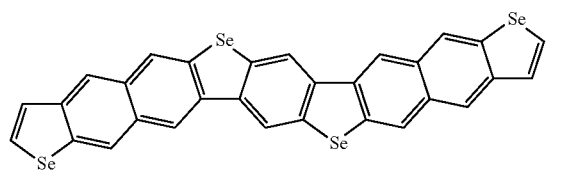
(35)
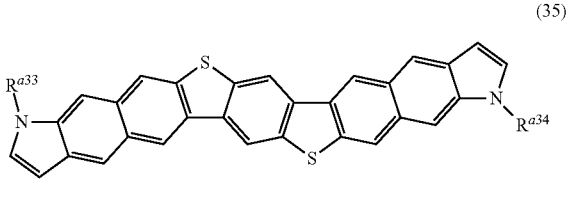
(36)
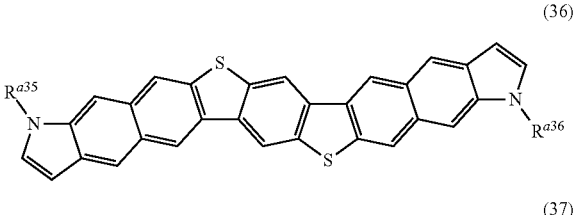
(37)
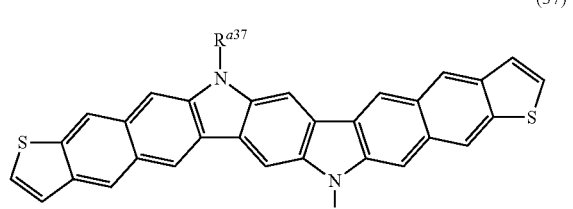
(38)
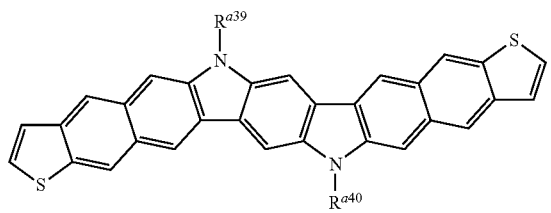
(39)
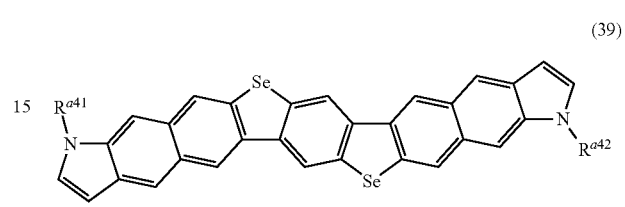
(40)
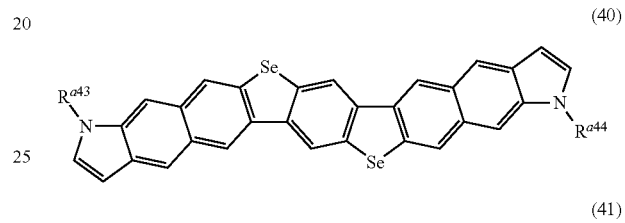
(41)
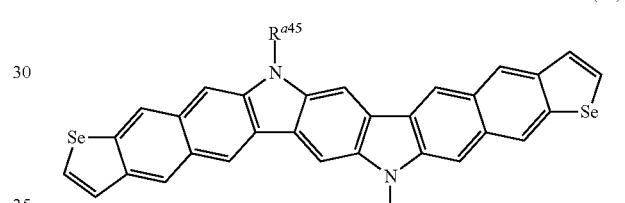
(42)
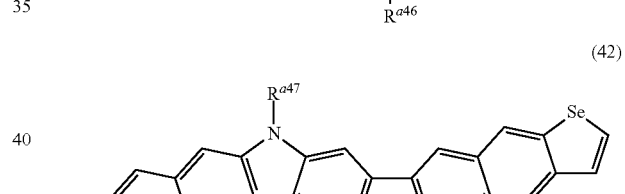
(43)
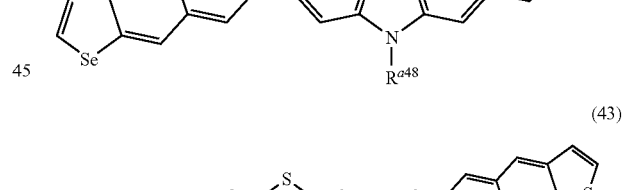
(44)
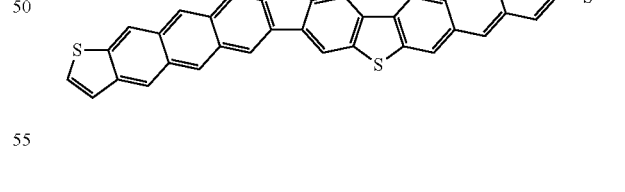
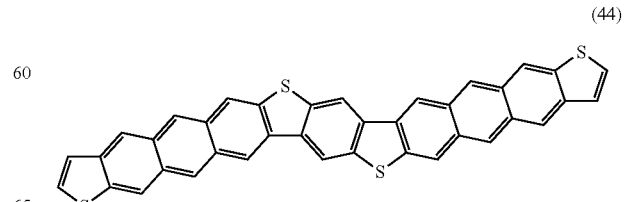

(45)
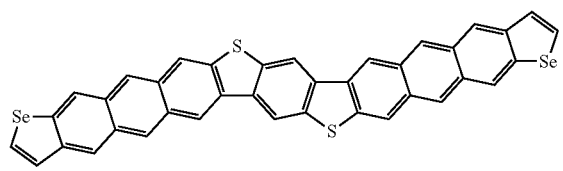

(46)
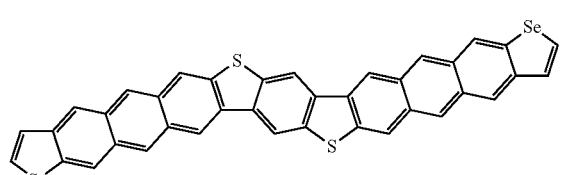

(47)
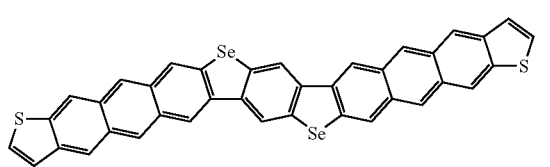

(48)
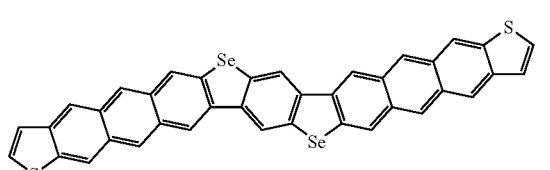

(49)
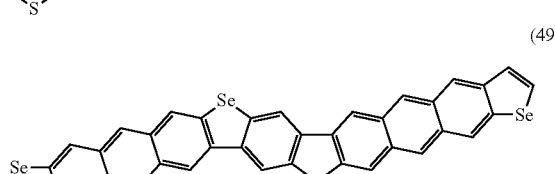

(50)
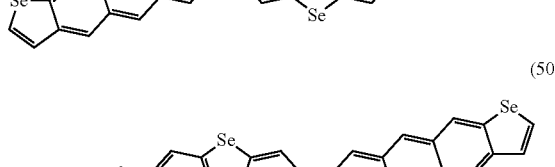

(51)
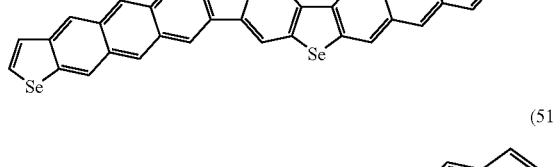

(52)
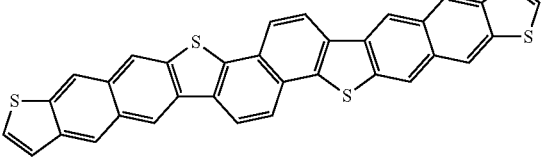

(53)
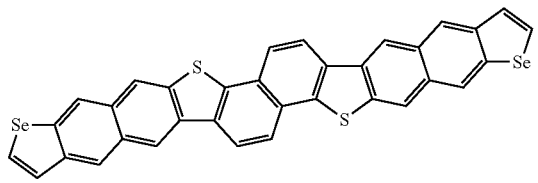

(54)
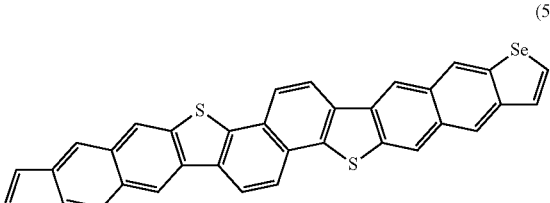

(55)
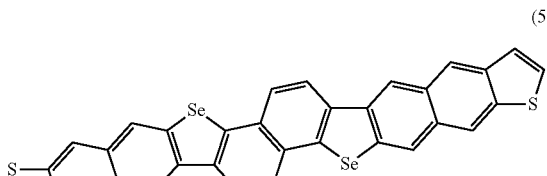

(56)
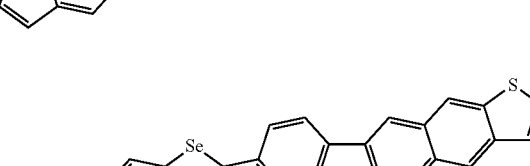

(57)
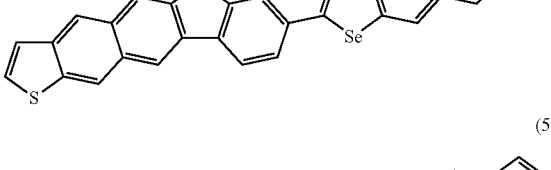

(58)
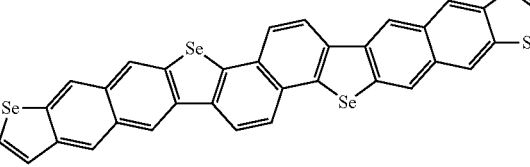

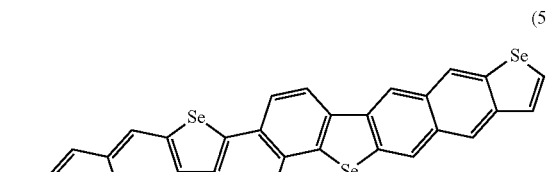

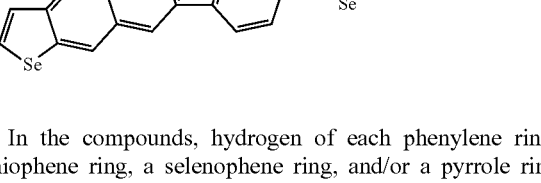

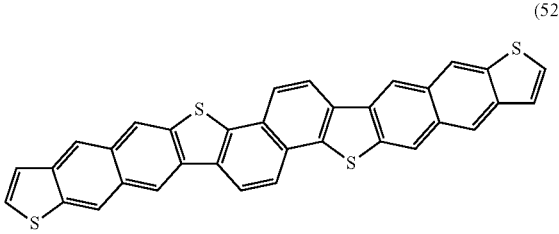

In the compounds, hydrogen of each phenylene ring, thiophene ring, a selenophene ring, and/or a pyrrole ring may be replaced by a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

An auxiliary layer (not shown) may be further included between the semiconductor stripe 154p and the gate insulating layer 140. The auxiliary layer may be, for example, a surface modifying layer. The auxiliary layer may modify a desired surface characteristics of the gate insulating layer 140 to be hydrophobic or hydrophilic and may be for example a self-assembled monolayer (SAM) including octadecyltrichlorosilane, but is not limited thereto.

Hereinafter, a method of manufacturing a thin film transistor according to an embodiment is described with reference to drawings.

FIGS. 8 to 11 are schematic views showing a method of manufacturing a thin film transistor according to some example embodiments.

Figure 8:
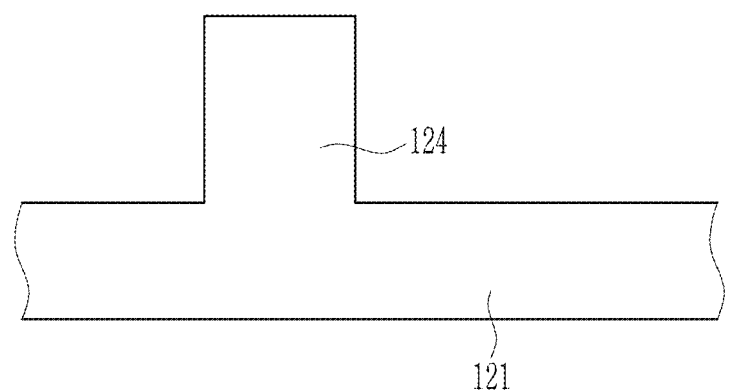
FIGS. 8 to 11 are schematic views showing a method of manufacturing a thin film transistor according to some example embodiments.

Referring to FIG. 8, a conductive layer (not shown) for a gate electrode may be formed on a substrate 110 and may be patterned by photolithography to form a gate line 121 including a gate electrode 124.

Subsequently, the gate insulating layer 140 may be formed on the whole surface of the substrate 110 including the gate electrode 124. The gate insulating layer 140 may be for example formed by depositing or coating silicon oxide ($SiO_2$), silicon nitride ($Si_xN_y$), aluminum oxide ($Al_2O_3$), or an organic insulator. The depositing may be a chemical vapor deposition (CVD), a vacuum deposition, thermal evaporation, or a laser deposition and the solution process may be a spin coating, a screen printing, a printing, an imprinting, a spin casting, a dipping, a roll coating, a drop casting, a spray coating, a roll printing, a slit coating, or inkjet printing, but is not limited thereto.

Figure 9:
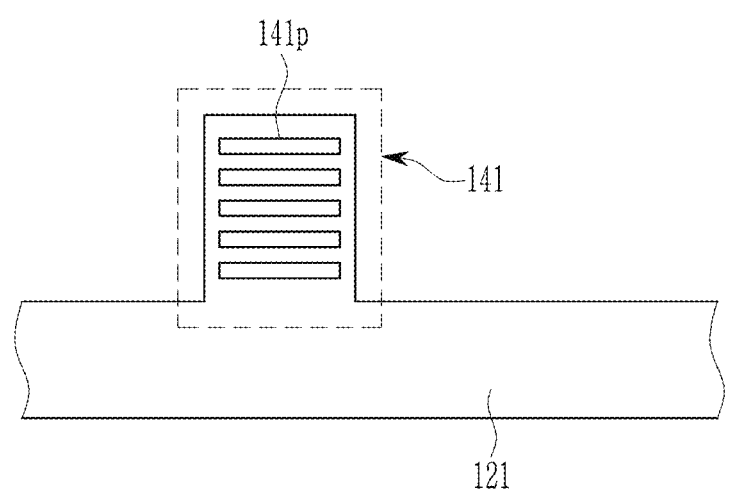

Referring to FIG. 9, a plurality of trenches regions 141 are defined in the gate insulating layer 140 and a plurality of trenches 141p are formed in each trench region 141. The trench regions 141 may be defined as predetermined regions overlapped with the gate electrode 124 and may be formed regularly along the rows and/or columns of the thin film transistor array panel 1000. The plurality of trenches 141p may be formed by for example photolithography, electron beam lithography (e-beam lithography), or imprinting, but is not limited thereto.

Subsequently, the gate insulating layer 140 may be surface-modified. For example, an auxiliary layer (not shown), such as a surface modifying layer may be further formed by aligning a self-assembled monolayer (SAM, not shown) with hydrophilicity or hydrophobicity on the gate insulating layer 140.

Figure 10:
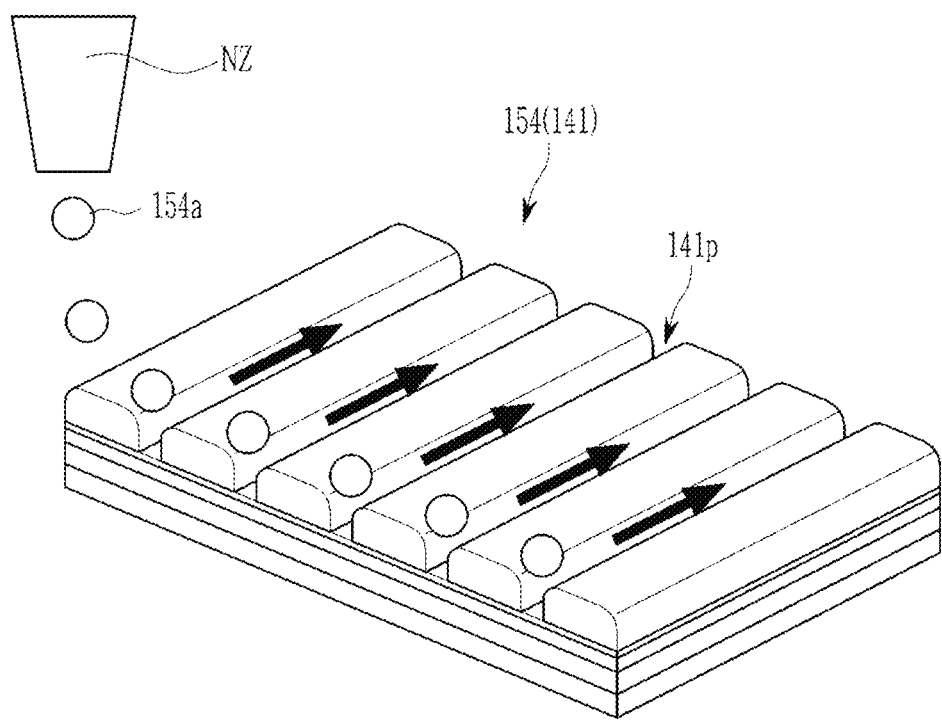

Then, referring to FIG. 10, a plurality of the channel region 154 overlapped with a plurality of trenches regions 141 may be defined and a semiconductor solution 154a may be supplied into the trench 141p of the gate insulating layer 140. For example, the semiconductor solution 154a may be dripped over the trench 141p using a nozzle NZ. The semiconductor solution may be for example supplied by inkjet printing, slit coating, drip casting, nozzle jet printing, or spraying, but is not limited thereto. The dripped semiconductor solution may spontaneously move from one end of the trench 141p to the transverse end of the trench 141p by a capillary effect to fill a plurality of trenches 141p. As such, since the semiconductor solution is spontaneously moved by the capillary effect, the alignment of the molecules in the semiconductor solution may be effectively improved.

Figure 11:
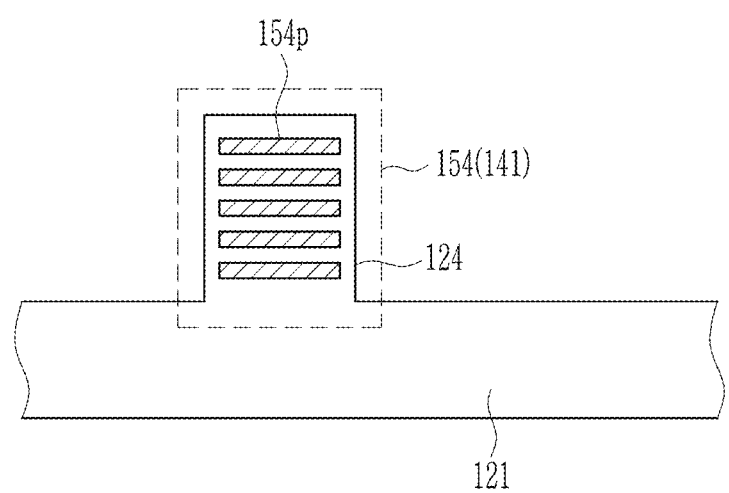

Then, referring to FIG. 11, the semiconductor solution filled in the trench 141p may be heat-treated to form a plurality of semiconductor stripes 154p. The heat-treating may be performed at a temperature of from about 40° C. to about 300° C. or for example about 50° C. to about 200° C. The heat-treating may be performed for about 5 minutes to about 3 hours, for example about 10 minutes to about 2 hours. The heat-treating may perform under a nitrogen atmosphere.

Referring to FIG. 3, a conductive layer for source and drain electrodes may be formed and may be patterned by photolithography to form the source electrode 173 and the drain electrode 175 which may partially overlap with the channel region 154. Alternatively, the source electrode 173 and the drain electrode 175 may be formed on the semiconductor layer 154 by using a metal mask.

Hereinafter, a thin film transistor according to some example embodiments is described.

The thin film transistor according to some example embodiments includes a gate electrode 124, a source electrode 173, a drain electrode 175, a gate insulating layer 140, and a channel region 154, like the aforementioned embodiment.

However, the thin film transistor according to some example embodiments further includes a reservoir portion 141q disposed at the periphery of the trench regions 141 of the gate insulating layer 140 and optionally further includes a semiconductor pattern 154q disposed at the periphery of the channel region 154 and occupying the reservoir portion 141q.

Figure 12:
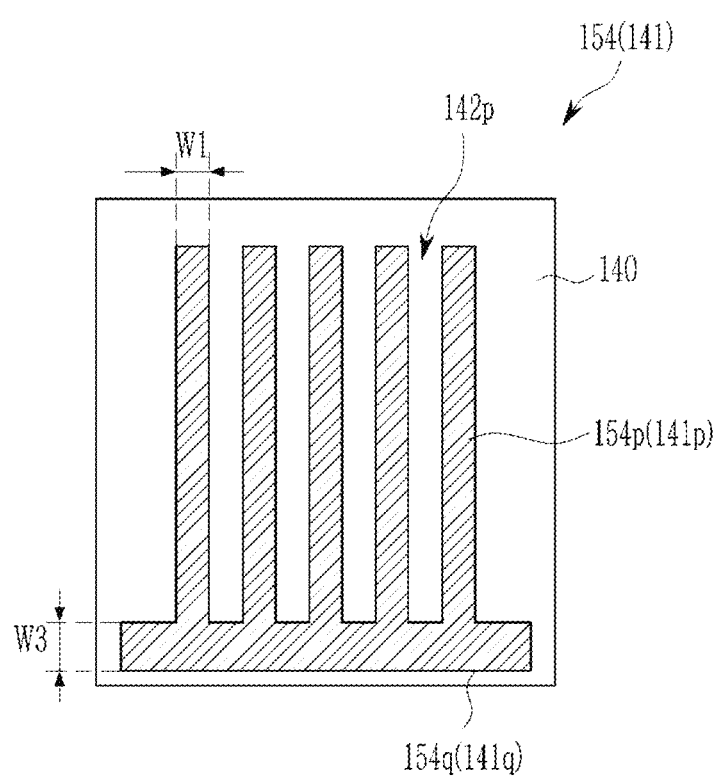
FIG. 12 is a top plan view showing an enlarged channel region according to some example embodiments of the thin film transistor of FIG. 3.

FIG. 12 is a top plan view showing an enlarged channel region according to some example embodiments of the thin film transistor of FIG. 3.

Referring to FIG. 12, a reservoir portion 141q may be at the periphery of trench regions 141 and may be connected to a plurality of trenches 141p. The reservoir portion 141q may be substantially vertical with the plurality of trenches 141q, and the width W3 of the reservoir portion 141q may be wider than the width (W1) of the trench 141p.

The reservoir portion 141q may be a drip space supplied with a semiconductor solution for forming the semiconductor stripe 154p. The semiconductor solution dripped in the reservoir portion 141q may spontaneously move from one end of the trench 141p to the transverse end by the capillary effect to form the semiconductor stripe 154p.

The semiconductor pattern 154q may be a residue remaining in the reservoir portion 141q of the semiconductor solution supplied to the reservoir portion 141q. The semiconductor pattern 154q may be disposed at the periphery of the channel region 154 of the thin film transistor 100 and may be connected to each of the plurality of semiconductor stripes 154p. However, the present disclosure is not limited thereto, and the semiconductor pattern 154q may not be connected to at least a portion of the plurality of semiconductor stripes 154p.

Hereinafter, a method of manufacturing the thin film transistor according to the aforementioned embodiment is described.

Figure 13:
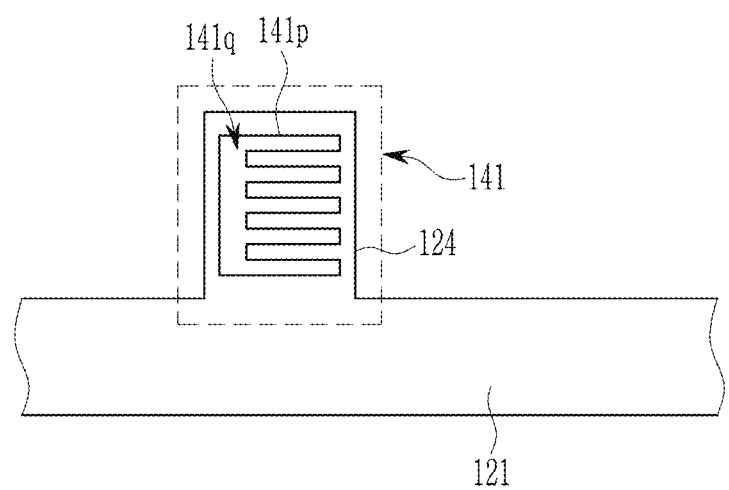
FIGS. 13 and 14 are schematic views of a method of manufacturing a thin film transistor according to some example embodiments.
Figure 14:
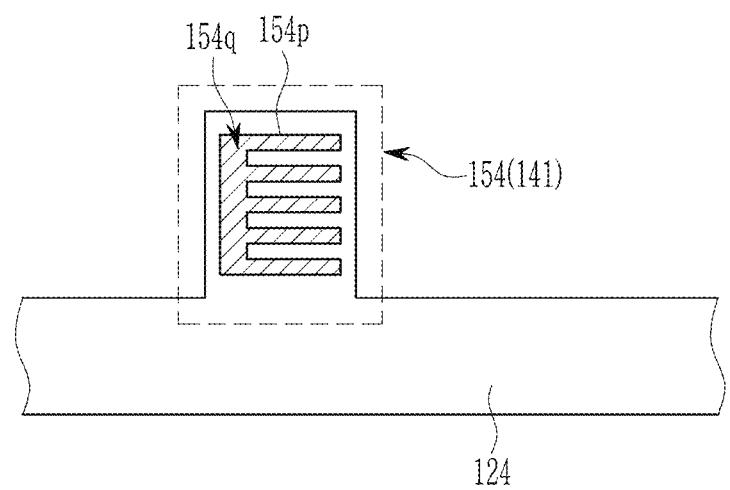

FIGS. 13 and 14 are schematic views of a method of manufacturing a thin film transistor according to some example embodiments.

A method of manufacturing the thin film transistor according to some example embodiments includes forming a gate line 121 including a gate electrode 124, forming a gate insulating layer 140 on the whole surface of the substrate 110, forming trench regions 141, forming a channel region 154, and forming a source electrode 173 and a drain electrode 175, like the aforementioned embodiment.

However, referring to FIG. 13, the method of manufacturing the thin film transistor according to some example embodiments includes an additional reservoir portion 141q connected to a plurality of trenches 141p in addition to the plurality of trenches 141p in each trench region 141. The reservoir portion 141p may be formed together with the plurality of trenches 141p or may be formed separately.

Subsequently, referring to FIG. 14, a semiconductor solution may be supplied to the reservoir portion 141q of the gate insulating layer 140. For example, the semiconductor solution may be dripped over the reservoir portion 141q. The semiconductor solution may be, for example, supplied by inkjet printing, slit coating, drip casting, nozzle jet printing, or spraying, but is not limited thereto. The dripped semiconductor solution in a dropwise fashion may spontaneously move from the reservoir portion 141q through one end of the trench 141p to the transverse end of the trench 141p due to the capillary effect and thus fill a plurality of trenches 141p.

Subsequently, heat-treating may be performed to remove the solvent in the semiconductor solution to form a plurality of semiconductor stripes 154p. The heat-treating may be for example performed at a temperature of about 40° C. to about 300° C., or for example about 50° C. to about 200° C. The heat-treating may be performed for about 5 minutes to about 3 hours, for example about 10 minutes to about 2 hours. The heat-treating may be for example performed under a nitrogen atmosphere.

Although the thin film transistor is illustrated as having a bottom gate structure, the architecture of the thin film transistor is not limited thereto, and the thin film transistor may be applied to all thin film transistor gate architectures.

The thin film transistor 100 or the thin film transistor array panel 1000 may be applied to a switch and/or driving device of various electronic devices, and the electronic device may be, for example, a liquid crystal display (LCD), an organic light emitting diode (OLED) display, an electrophoretic display device, an organic sensor, or a wearable device.

Hereinafter, the embodiments are illustrated in more detail with reference to examples. However, a person having ordinary skill in the art would understand the present disclosure is not limited thereto.

Manufacture of Thin Film Transistor

Example 1

Figure 15:
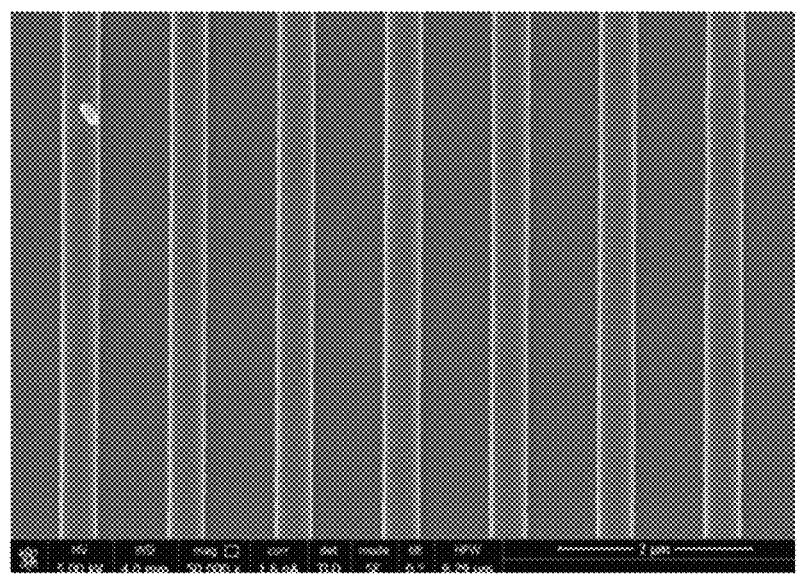
FIG. 15 is a scanning electron microscopic (SEM) photograph of a gate insulating layer in which a plurality of trenches are formed in Example 1.

A 200 nm-thick gate insulating layer is formed on a silicon wafer substrate by thermally depositing $SiO_2$. Subsequently, a trench region is set on the gate insulating layer, and photolithography is performed in the trench region to form a plurality of trenches and a reservoir portion. The reservoir portion is located around the trench region and thus connected to the plurality of trenches. A width, a length, and a depth of one trench are respectively about 700 nm, about 100 μm, and about 50 nm, and a distance between neighboring trenches is about 400 nm. FIG. 15 is a scanning electron microscopic (SEM) photograph of the gate insulating layer in which the plurality of trenches are formed in Example 1.

Figure 16:
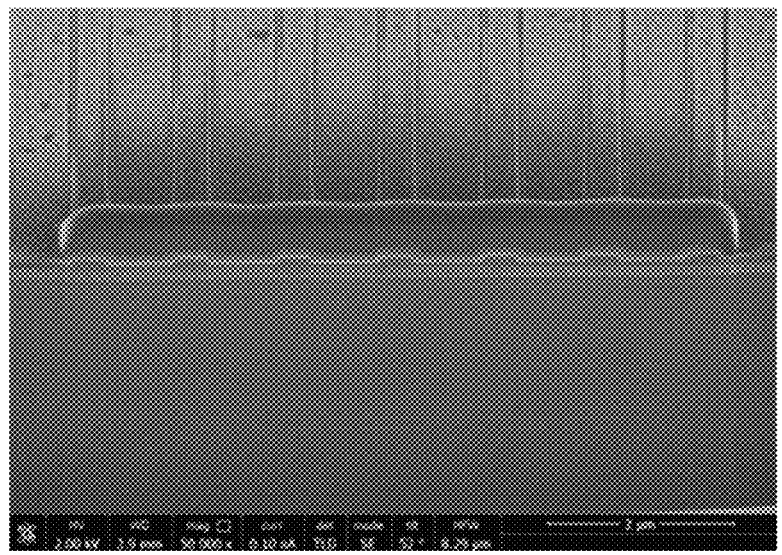
FIG. 16 is a scanning electron microscopic (SEM) photograph showing a dripped form of the organic semiconductor solution in the reservoir portion in Example 1.

Subsequently, the gate insulating layer is surface-treated by using $O_2$ plasma with 100 power for 60 seconds and then, surface-modified by dipping a substrate for one hour in a solution for a self-assembled monolayer, which is prepared by diluting octadecyltrichlorosilane (ODTS) in hexane into a concentration of 3 mM. Next, an organic semiconductor solution is prepared by dissolving an organic semiconductor represented by Chemical Formula A in o-dichlorobenzene into a concentration of 0.2 wt %. Then, the organic semiconductor solution is dripped in the reservoir portion around the trench region of the gate insulating layer in an Inkjet printing method. FIG. 16 is a scanning electron microscopic (SEM) photograph showing the dripped form of the organic semiconductor solution in the reservoir portion in Example 1.

Subsequently, the organic semiconductor solution is filled in the plurality of trenches and then, heat-treated at 150° C. for 30 minutes to form a plurality of semiconductor stripes filled in the plurality of trenches. Then, a metal mask is used to deposit gold (Au) to form a 1000 Å-thick source electrode and drain electrode and thus manufacture a thin film transistor. The channel width and channel length of the thin film transistor are 318 μm and 100 μm, respectively.

[Chemical Formula A]

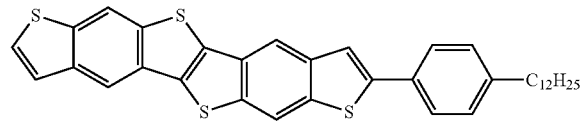

Example 2

A thin film transistor is manufactured according to the same method as Example 1 except that a distance between the adjacent trenches in the trench region of the gate insulating layer is about 900 nm. A channel of the thin film transistor has a width of 218 μm and a length of 100 μm.

Figure 17:
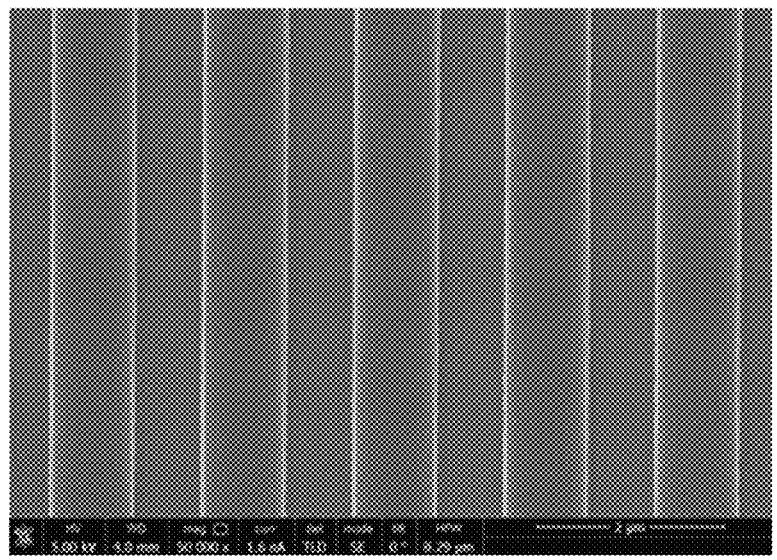
FIG. 17 is a scanning electron microscopic (SEM) photograph of a gate insulating layer in which a plurality of trenches are formed in Example 2.
Figure 18:
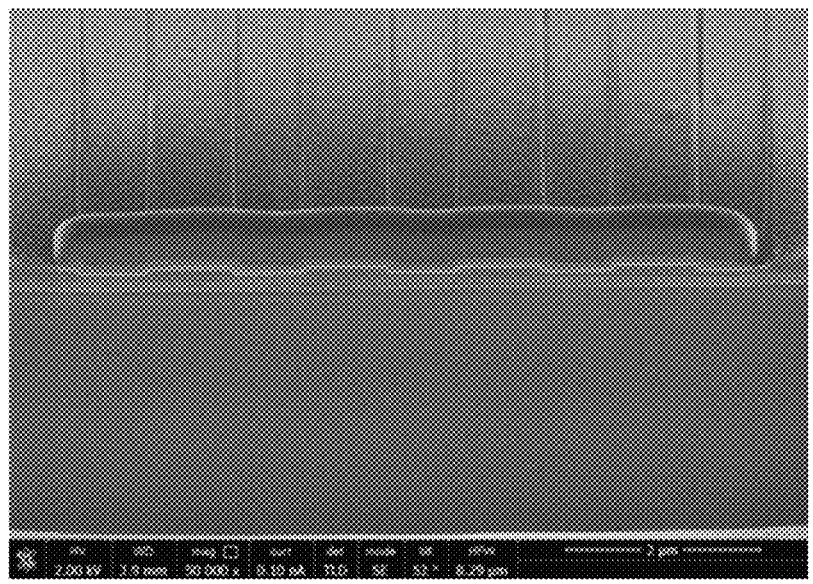
FIG. 18 is a scanning electron microscopic (SEM) photograph showing a dripped form of the organic semiconductor solution in the reservoir portion in Example 2.

FIG. 17 is a scanning electron microscopic (SEM) photograph of a gate insulating layer in which a plurality of trenches are formed in Example 2, and FIG. 18 is a scanning electron microscopic (SEM) photograph showing a dripped form of the organic semiconductor solution in the reservoir portion in Example 2.

Comparative Example 1

A thin film transistor is manufactured according to the same method as Example 1 except that the plurality of trenches and the reservoir portion are not formed in the gate insulating layer.

EVALUATION

Charge mobility of the thin film transistors according to Examples 1 and 2 and Comparative Example 1 are evaluated.

The charge mobility is obtained from a slope of a graph having variables of $(I_{SD})^{1/2}$ and $V_G$, which is obtained from a saturation region current formula.

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the equations, $I_{SD}$ is a source-drain current, μ or μFET is the charge mobility, $C_0$ is capacitance of a gate insulating layer, W is a channel width, L is a channel length, $V_G$ is a gate voltage, and $V_T$ is a threshold voltage.

The results are shown in Table 1.

TABLE 1

|  | Charge mobility (cm$^2$/Vs) |
| --- | --- |
| Example 1 | 3.9 |
| Example 2 | 2.7 |
| Comparative Example 1 | 1.1 |

Referring to Table 1, the thin film transistors according to Examples 1 and 2 show higher charge mobility than the thin film transistor according to Comparative Example 1.

While this disclosure has been described in connection with what is presently considered to be practical example embodiments, it is to be understood that the inventive concept is not limited to the disclosed embodiments. On the contrary, it is intended to cover various modifications and equivalent arrangements included within the spirit and scope of the appended claims.

What is claimed is:

1. A thin film transistor comprising:
a source electrode,
a drain electrode,
a channel region between the source electrode and the drain electrode, and
a gate electrode overlapped with the channel region,
wherein the channel region comprises a plurality of semiconductor stripes connecting the source electrode to the drain electrode.

2. The thin film transistor of claim 1, wherein the channel region comprises alternating semiconductor stripes and insulating stripes.

3. The thin film transistor of claim 1, wherein a width of each semiconductor stripe is about 100 nm to about 10 μm.

4. The thin film transistor of claim 1, wherein a distance between the semiconductor stripes is about 100 nm to about 5 μm.

5. The thin film transistor of claim 1, wherein the plurality of semiconductor stripes are parallel to each other.

6. The thin film transistor of claim 1, wherein the channel region further comprises a semiconductor pattern at one end of the plurality of semiconductor stripes.

7. The thin film transistor of claim 1, further comprising a gate insulating layer, the gate insulating layer having a plurality of trenches in the channel region, and
the plurality of semiconductor stripes is disposed in the plurality of trenches.

8. The thin film transistor of claim 7, wherein the plurality of trenches extend from the source electrode to the drain electrode.

9. The thin film transistor of claim 7, wherein a width of each trench is about 100 nm to about 10 μm.

10. The thin film transistor of claim 7, wherein a depth of each trench is about 20% to about 80% a thickness of the gate insulating layer.

11. The thin film transistor of claim 7, wherein a thickness of the semiconductor stripes is about 20% to about 80% a thickness of the gate insulating layer.

12. The thin film transistor of claim 7, wherein the gate insulating layer has a reservoir portion, the reservoir portion connecting the plurality of trenches.

13. The thin film transistor of claim 12, further comprising a semiconductor pattern in the reservoir portion of the gate insulating layer.

14. The thin film transistor of claim 1, wherein the plurality of semiconductor stripes comprise an organic semiconductor.

15. The thin film transistor for claim 14, wherein the organic semiconductor is represented by Chemical Formula 1A or Chemical Formula 1B:

[Chemical Formula 1A]

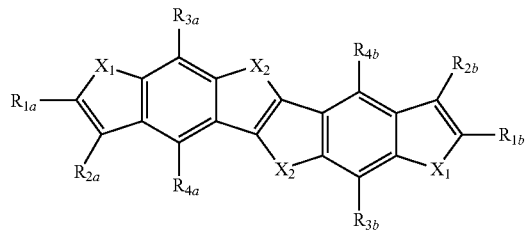

[Chemical Formula 1B]

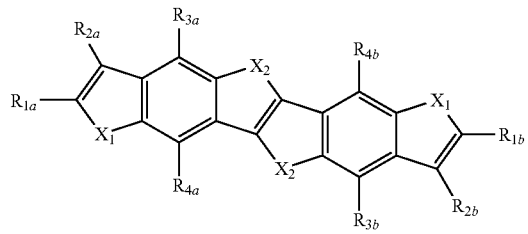

where,

X1 and X2 are each independently one of a O, S, Se, Te, or N-Ra,

Ra is hydrogen, a substituted or unsubstituted C1 to C20 alkyl group, a substituted or unsubstituted C6 to C30 arylalkyl group, a substituted or unsubstituted C6 to C30 aryl group, a substituted or unsubstituted C1 to C12 alkoxy group, a substituted or unsubstituted C1 to C30 acyl group, a sulfonyl group, or a carbamate group, and $R_{1a}$, $R_{1b}$, $R_{2a}$, $R_{2b}$, $R_{3a}$, $R_{3b}$, $R_{4a}$, and $R_{4b}$ are each independently a hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

16. The thin film transistor of claim 14 wherein the organic semiconductor is represented by Chemical Formula 2A or Chemical Formula 2B:

[Chemical Formula 2A]

[Chemical Formula 2B]

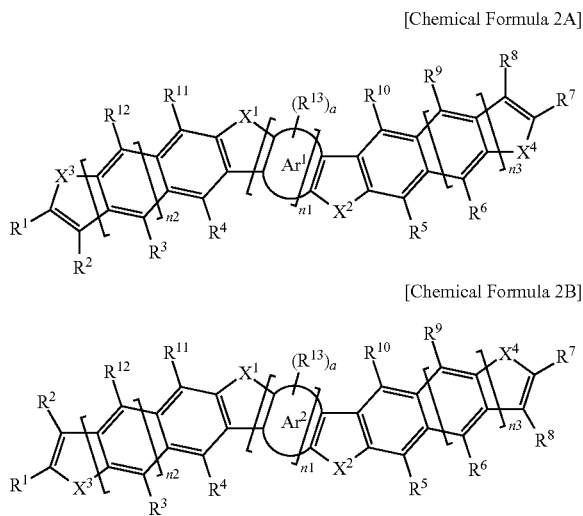

where,

Ar¹ and Ar² are each independently phenylene, naphthalene, or anthracene, $X^1$ to $X^4$ are each independently O, S, Se, Te, or N-Ra, $R^a$ is independently a hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C7 to C30 arylalkyl group, a substituted or unsubstituted C6 to C30 aryl group, a substituted or unsubstituted C1 to C30 alkoxy group, a substituted or unsubstituted C6 to C30 aryloxy group, a substituted or unsubstituted C4 to C30 cycloalkyl group, a substituted or unsubstituted C4 to C30 cycloalkyloxy group, a substituted or unsubstituted C2 to C30 heteroaryl group, an acyl group, a sulfonyl group, or a carbamate group, $R^1$ to $R^{13}$ are each independently a hydrogen, a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group, n1 is 0 or 1, and n2 and n3 are each independently 0, 1, 2, or 3.

17. The thin film transistor of claim 14 wherein the organic semiconductor is molecularly aligned with the plurality of semiconductor stripes.

18. A thin film transistor array panel comprising the thin film transistor of claim 1.

19. An electronic device comprising the thin film transistor array panel of claim 18.

20. A method of manufacturing a thin film transistor comprising:

forming a gate electrode, forming a gate insulating layer having a plurality of trenches, the gate insulating layer overlapped the gate electrode, forming a channel region comprising a plurality of semiconductor stripes by supplying a semiconductor solution to the plurality of trenches, and forming a source electrode and a drain electrode electrically connected to the channel region.

21. The method of claim 20, wherein the forming of the gate insulating layer having the plurality of trenches is performed by photolithography, electron beam lithography, or imprinting.

22. The method of claim 20, wherein the supplying the semiconductor solution to the plurality of trenches comprises:

supplying the semiconductor solution to one end of at least one of the plurality of trenches, and transferring the semiconductor solution from the one end of the at least one of the plurality of trenches to a transverse end of the at least one of the plurality of trenches.

23. The method of claim 22, wherein the supplying the semiconductor solution is performed by inkjet printing, slit coating, drip casting, nozzle jet printing, or spraying.

24. The method of claim 20, wherein the gate insulating layer has a reservoir portion connected to at least one of the plurality of trenches, and the supplying the semiconductor solution to the plurality of trenches comprises:

supplying the semiconductor solution to the reservoir portion and transferring the semiconductor solution from the reservoir portion through one end of the at least one of the plurality of trenches to a transverse end of the at least one of the plurality of trenches.

25. The method of claim 24, wherein the supplying the semiconductor solution is performed by inkjet printing, slit coating, drip casting, nozzle jet printing, or spraying.

26. The method of claim 20, wherein the forming the channel region further comprises heat-treating.

27. A thin film transistor array panel comprising:

a plurality of thin film transistors arranged in rows and columns, the thin film transistors comprised of a plurality of semiconductor stripes that overlap with a gate electrode, the plurality of semiconductor stripes connecting a source electrode and a drain electrode.

28. The thin film transistor array panel of claim 27, wherein the plurality of semiconductor stripes extend in a direction from the source electrode to the drain electrode.

29. The thin film transistor array panel of claim 28, wherein the plurality of semiconductor stripes are parallel to each other.

30. The thin film transistor array panel of claim 27, further comprising a gate insulating layer on a surface of the thin film transistor array panel, and the plurality of semiconductor stripes are embedded in the gate insulating layer.

31. The thin film transistor array panel of claim 30, wherein the gate insulating layer includes a plurality of trench regions, each trench region comprising a plurality of trenches extending in a direction from the source electrode to the drain electrode.

32. The thin film transistor array panel of claim 31, wherein semiconductor stripes are disposed in the plurality of trenches.

33. The thin film transistor array panel of claim 31, wherein each trench region further comprises a reservoir portion that is connected to the plurality of trenches.

34. An electronic device comprising the thin film transistor array panel of claim 27.

\* \* \* \* \*